United States Patent
Bhatia et al.

(10) Patent No.: US 11,074,128 B2
(45) Date of Patent: Jul. 27, 2021

(54) MEMORY SYSTEM WITH HYBRID ITERATIVE DECODING CAPABILITY AND METHOD OF OPERATING SUCH MEMORY SYSTEM

(71) Applicant: SK hynix Inc., Gyeonggi-do (KR)

(72) Inventors: Aman Bhatia, San Jose, CA (US);
Chenrong Xiong, San Jose, CA (US);
Fan Zhang, San Jose, CA (US);
Naveen Kumar, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/400,534

(22) Filed: May 1, 2019

(65) Prior Publication Data
US 2019/0340071 A1    Nov. 7, 2019

Related U.S. Application Data

(60) Provisional application No. 62/666,406, filed on May 3, 2018.

(51) Int. Cl.
*G06F 11/10* (2006.01)
*H03M 13/11* (2006.01)

(52) U.S. Cl.
CPC ....... *G06F 11/1076* (2013.01); *H03M 13/118* (2013.01); *H03M 13/1111* (2013.01); *H03M 13/1197* (2013.01)

(58) Field of Classification Search
CPC .......... G06F 11/1076; H03M 13/1197; H03M 13/118; H03M 13/1111; H03M 13/1117; H03M 13/114; G11C 29/42
See application file for complete search history.

(56) References Cited

U.S. PATENT DOCUMENTS

| | | | |
|---|---|---|---|
| 8,006,161 B2* | 8/2011 | Lestable | H03M 13/1117 714/755 |
| 8,984,376 B1 | 3/2015 | Norrie | |
| 2005/0262420 A1 | 11/2005 | Park et al. | |
| 2014/0059401 A1* | 2/2014 | Chung | H04L 1/0057 714/752 |
| 2014/0068381 A1* | 3/2014 | Zhang | H03M 13/6331 714/770 |
| 2014/0082449 A1* | 3/2014 | Zhang | H03M 13/112 714/752 |
| 2014/0208180 A1* | 7/2014 | Li | H03M 13/3753 714/752 |

(Continued)

OTHER PUBLICATIONS

Tyler Brandon et al. "A scalable LDPC decoder ASIC architecture with bit-serial message exchange" Integration vol. 41, Issue 3, 2008, pp. 385-398, (Year: 2008).*

(Continued)

*Primary Examiner* — Cynthia Britt
(74) *Attorney, Agent, or Firm* — IP & T Group LLP

(57) ABSTRACT

Memory controllers, decoders and methods to perform decoding of user bits and parity bits including those corresponding to low degree variable nodes. For each of the user bits, the decoder performs a variable node update operation and a check node update operation for connected check nodes. After all of the user bits are processed, the decoder performs a parity node update operation for the parity bits using results of the variable node and check node update operations performed on the user bits.

19 Claims, 8 Drawing Sheets

(56) References Cited

U.S. PATENT DOCUMENTS

| | | | |
|---|---|---|---|
| 2015/0227403 A1* | 8/2015 | Zhang | H03M 13/373 714/704 |
| 2016/0274971 A1* | 9/2016 | Kang | G06F 11/1012 |
| 2019/0028117 A1* | 1/2019 | Xiong | H03M 13/1182 |
| 2019/0097656 A1* | 3/2019 | Bhatia | H03M 13/6502 |

OTHER PUBLICATIONS

C. Hsu and A. Anastasopoulos, "Capacity-Achieving Codes With Bounded Graphical Complexity and Maximum Likelihood Decoding," in IEEE Transactions on Information Theory, vol. 56, No. 3, pp. 992-1006, Mar. 2010. (Year: 2010).*

M. Chiu, "Bandwidth-Efficient Modulation Codes Based on Nonbinary Irregular Repeat-Accumulate Codes," in IEEE Transactions on Information Theory, vol. 56, No. 1, pp. 152-167, Jan. 2010. (Year: 2010).*

C. Wang and H. D. Pfister, "Upper bounds on the MAP threshold of iterative decoding systems with erasure noise," 2008 5th International Symposium on Turbo Codes and Related Topics, Lausanne, 2008, pp. 7-12. (Year: 2008).*

X. Ye and F. Gao, "A decode-and-forward scheme for LDPC coded three-way relay fading channels," in China Communications, vol. 12, No. 8, pp. 46-54, Aug. 2015. (Year: 2015).*

M. Yang, W. E. Ryan and Yan Li, "Design of efficiently encodable moderate-length high-rate irregular LDPC codes," in IEEE Transactions on Communications, vol. 52, No. 4, pp. 564-571, Apr. 2004.

Chenrong Xiong et al, Low complexity LDPC encoder, U.S. Appl. No. 15/654,492.

Xiao-Yu Hu, E. Eleftheriou, D. M. Arnold and A. Dholakia, "Efficient implementations of the sum-product algorithm for decoding LDPC codes," Global Telecommunications Conference, 2001. GLOBECOM '01. IEEE, San Antonio, TX, 2001, pp. 1036-1036E vol. 2.

M. Fossorier, M. Mihaljević, H. Imai, "Reduced complexity iterative decoding of low density parity check codes based on belief propagation", IEEE Trans. Commun., vol. 47, pp. 673-680, May 1999.

Juntan Zhang and M. P. C. Fossorier, "Shuffled iterative decoding," in IEEE Transactions on Communications, vol. 53, No. 2, pp. 209-213, Feb. 2005.

A. Viterbi, "Error bounds for convolutional codes and an asymptotically optimum decoding algorithm," in IEEE Transactions on Information Theory, vol. 13, No. 2, pp. 260-269, Apr. 1967.

J. Hagenauer and P. Hoeher, "A Viterbi algorithm with soft-decision outputs and its applications," Global Telecommunications Conference and Exhibition 'Communications Technology for the 1990s and Beyond' (GLOBECOM), 1989. IEEE, Dallas, TX, 1989, pp. 1680-1686 vol. 3.

L.Bahl, J.Cocke, F.Jelinek, and J.Raviv, "Optimal Decoding of Linear Codes for minimizing symbol error rate", IEEE Transactions on Information Theory, vol. IT-20(2), pp. 284-287, Mar. 1974.

Yang et al., Design of Efficiently Encodable Moderate-Length High-Rate Irregular LDPC Codes, IEEE Transactions on Communications, pp. 564-571, Apr. 2004, vol. 52, No. 4.

Hu et al., Efficient Implementations of the Sum-Product Algorithm for Decoding LDPC Codes, IEEE Global Telecommunications Conference (GLOBECOM '01), Nov. 2001, pp. 1036-1036E, vol. 2.

Fossorier et al., Reduced Complexity Iterative Decoding of Low-Density Parity Check Codes Based on Belief Propagation, IEEE Transactions on Communications, pp. 673-680, May 1999, vol. 47, No. 5.

Zhang et al., Shuffled Iterative Decoding, IEEE Transactions on Communications, pp. 209-213, Feb. 2005, vol. 53, No. 2.

Andrew J. Viterbi, Error Bounds for Convolutional Codes and an Asymptotically Optimum Decoding Algorithm, IEEE Transactions on Information Theory, pp. 260-269, Apr. 1967, vol. 13, No. 2.

Hagenauer et al., A Viterbi Algorithm with Soft-Decision Outputs and its Applications, IEEE Global Telecommunications Conference and Exhibition 'Communications Technology for the 1990s and Beyond', pp. 1680-1686, Nov. 1989, vol. 3.

Bahl et al., Optimal Decoding of Linear Codes for Minimizing Symbol Error Rate, IEEE Transactions on Information Theory, pp. 284-287, Mar. 1974, vol. 20, No. 2.

* cited by examiner

FIG. 4

$$
H = \begin{bmatrix} 1 & 0 & 1 & 0 & 1 & 0 & 0 & 0 & 0 & 0 & 0 \\ 0 & 1 & 1 & 0 & 1 & 1 & 0 & 0 & 0 & 0 & 0 \\ 1 & 0 & 0 & 1 & 0 & 1 & 1 & 0 & 0 & 0 & 0 \\ 0 & 1 & 0 & \cdots & 1 & 0 & 0 & 1 & 1 & 0 & 0 & 0 \\ 0 & 0 & 1 & 1 & 0 & 0 & 0 & 1 & 1 & 0 & 0 \\ 1 & 0 & 0 & 0 & 0 & 0 & 0 & 0 & 1 & 1 & 0 \\ 0 & 1 & 0 & 0 & 0 & 0 & 0 & 0 & 0 & 1 & 1 \end{bmatrix}
$$

40 — Matrix H

41 — User bits
42 — Parity bits

MEMORY SYSTEM WITH HYBRID ITERATIVE DECODING CAPABILITY AND METHOD OF OPERATING SUCH MEMORY SYSTEM

CROSS-REFERENCE TO RELATED APPLICATION

This application claims the benefit of U.S. Provisional Application No. 62/666,406, filed May 3, 2018, the entire content of which is incorporated herein by reference.

BACKGROUND

1. Field

Embodiments of the present disclosure relate to a memory system and components thereof capable of performing iterative decoding with hybrid operations, and method of operating such memory system.

2. Description of the Related Art

The computer environment paradigm has shifted to ubiquitous computing systems that can be used anytime and anywhere. As a result, the use of portable electronic devices, such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices used as memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data. LDPC codes are a class of linear block codes, which are characterized by a parity-check matrix that contains only a few 1's compared to the number of 0's.

Extended irregular repeat-accumulate (eIRA) codes are a class of LDPC codes that can be represented with a bi-diagonal structure in the parity-check matrix corresponding to the parity bits. It has been shown that eIRA codes can be linear-time encoded and have excellent error correcting performance. Decoding of these codes is performed using iterative message-passing methods known for LDPC codes, such as sum-product algorithm (SPA) or min-sum (MS) algorithm. However, the parity bits using degree-2 and degree-1 variable nodes are vulnerable to errors and converge slowly during iterative decoding of these codes.

In this context embodiments of the present invention arise.

SUMMARY

Aspects of the present invention include memory controllers and decoders. In one aspect, a memory controller comprises a decoder to perform decoding of user bits and parity bits including parity bits corresponding to low degree variable nodes. The decoder is further configured to perform for each of the user bits a variable node update operation, and a check node update operation for connected check nodes. The decoder is further configured to perform a separate parity node update operation for the parity bits using results of the variable node and check node update operations performed on the user bits. That is, the parity node update operation is separate from the variable and check node update operations.

In another aspect a decoder comprises a user nodes operator, a check nodes operator, parity nodes operator, and a scheduler to control the order in which these operators are used. The user nodes operator is scheduled by the scheduler to update variable nodes for associated user bits to obtain first decoding estimates. The check nodes operator is scheduled by the scheduler to update check nodes connected to the variable nodes using the first decoding estimates to obtain second decoding estimates. The parity nodes operator is scheduled to update parity bits using the first and second decoding estimates.

Further aspects of the present invention include methods of decoding, which may be performed by memory controllers and components thereof such as decoders. In this regard, another aspect of the present invention, entails a method of decoding an LDPC code, e.g., an eIRA code. The method comprises performing a variable node update operation for a first user bit; performing a check node update operation for each check node connected to the variable node for the first user bit; repeating the performing of the variable node and check node update operations for a second user bit and each subsequent user bit of the LDPC code; and performing an update on parity nodes using information obtained from the variable node and check node update operations.

Additional aspects of the present invention will become apparent from the following description.

BRIEF DESCRIPTION OF THE DRAWINGS

FIG. 4 illustrates a matrix of an eIRA code with bi-diagonal structure in the parity-check matrix portion.

DETAILED DESCRIPTION

Figure 1:
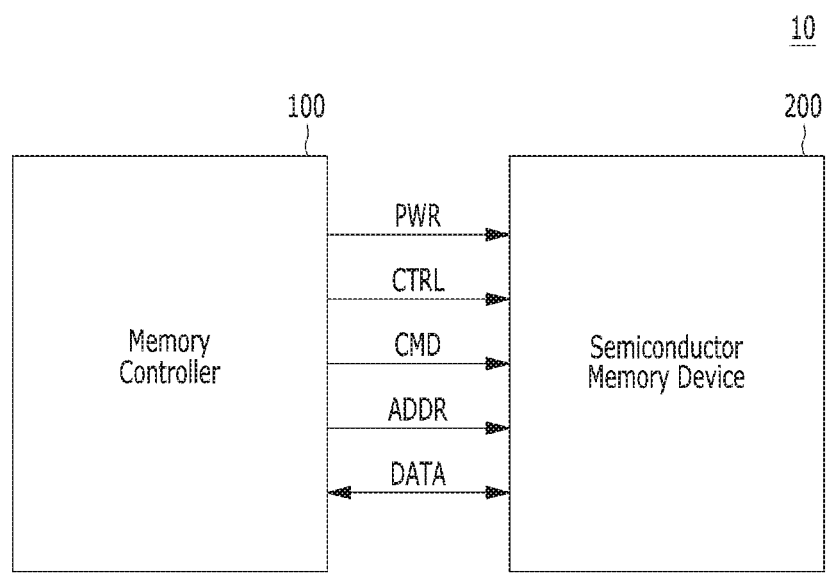
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring to FIG. 1, the memory system 10 may include a memory controller 100 and a semiconductor memory device 200, which may represent more than one such device. The semiconductor memory device(s) 200 may be flash memory device(s), particularly of the NAND-type. For brevity, semiconductor memory device 200 is sometimes simply referred to as memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

In another embodiment, the memory system 10 may be provided as one of various components in an electronic device, such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
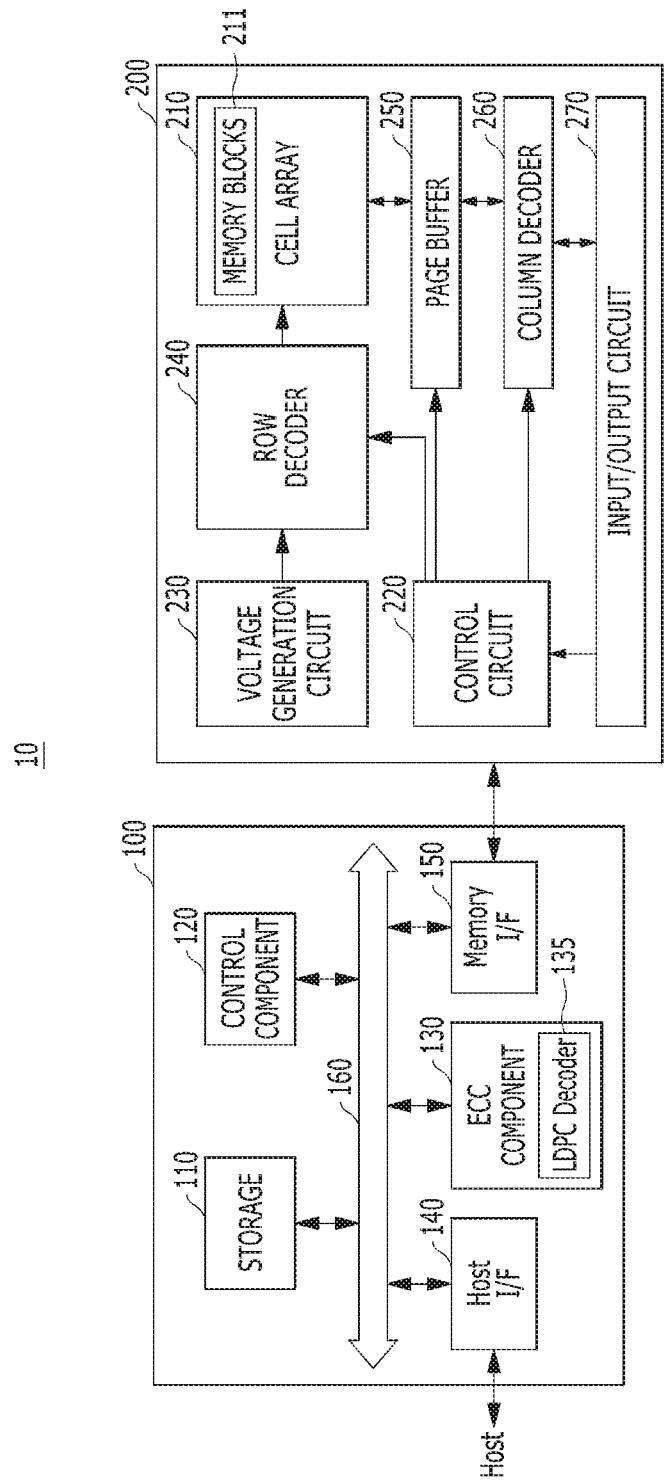
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device, such as a desktop computer, a workstation, a three-dimensional (3D)

television, a smart television, a digital audio recorder, a digital audio player, a digital picture recorder, a digital picture player, and/or a digital video recorder and a digital video player. In some embodiments, the host device may include a portable electronic device, such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device, such as a dynamic random access memory (DRAM) and/or a static random access memory (SRAM) or a non-volatile memory device, such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor, e.g., a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations, such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation, such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), and a block coded modulation (BCM).

Extended irregular repeat-accumulate (eIRA) codes, which are a class of LDPC codes, are of particular relevance to embodiments of the present invention. Thus, the ECC component 130 may include any and all circuits, systems or devices, represented by LDPC decoder 135, for suitable error correction operation, including detecting and correcting errors in eIRA codes in accordance with embodiments of the present invention. An example of specific processing blocks within the LDPC decoder 135 are described in connection with FIG. 6 below.

The host interface 140 may communicate with the host device through one or more of various interface protocols, such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
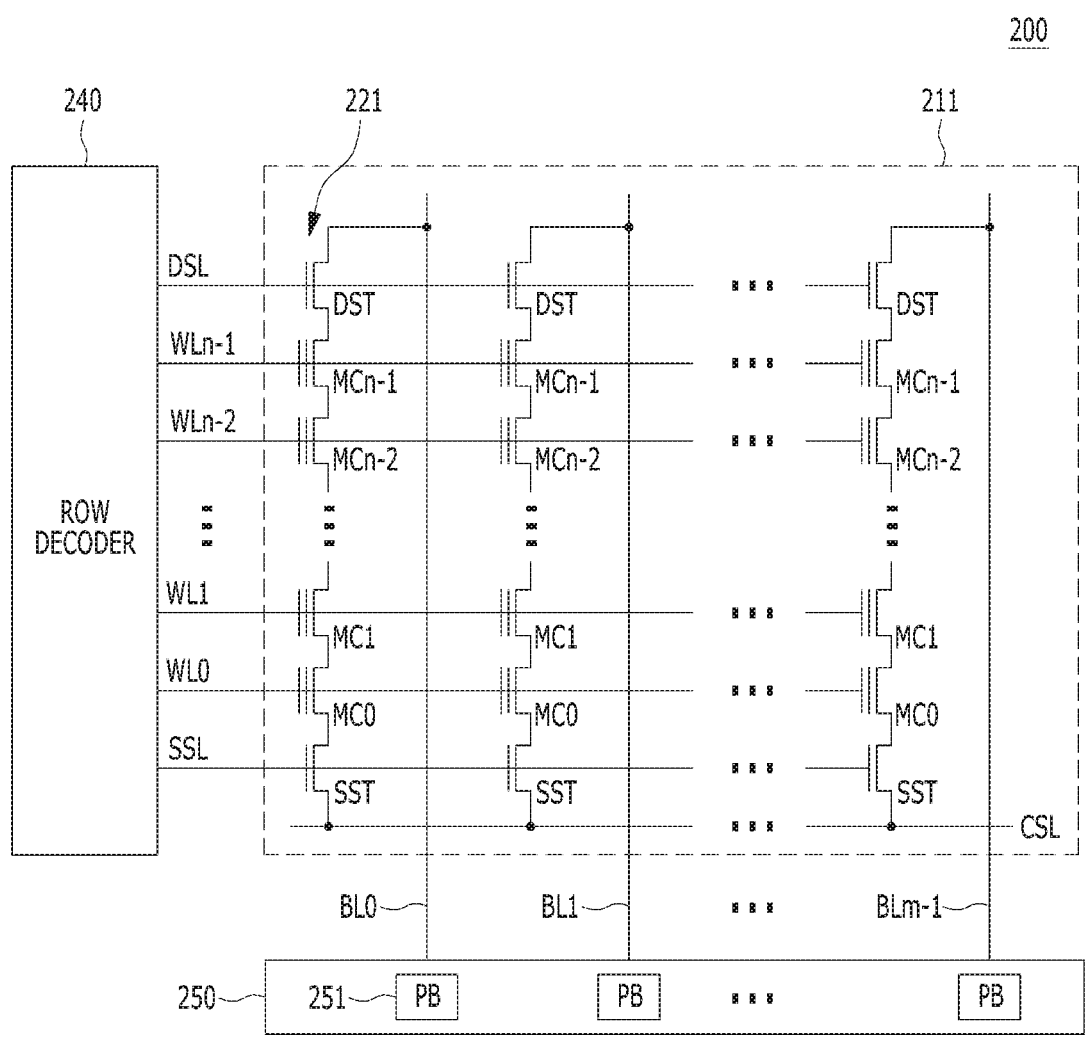
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

As previously noted, eIRA codes are a class of LDPC codes that can be represented with a bi-diagonal structure of the parity bits of the parity-check matrix. A matrix H 40 representing the user bits 41 and the parity bits 42 of an eIRA code is shown in FIG. 4. As can be seen, the parity bits 42 in the parity-check matrix portion have a bi-diagonal structure.

Figure 5:
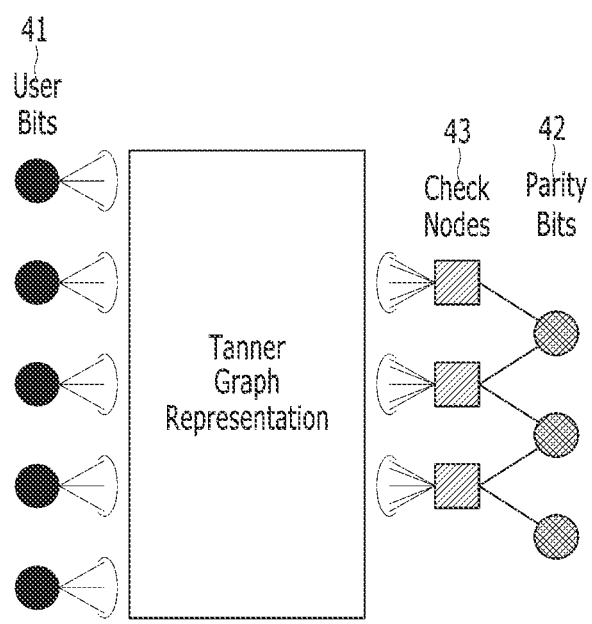
FIG. 5 is a Tanner graph representation of an eIRA code, showing user bits, check nodes and parity bits.

A Tanner graph representation of an eIRA code, with user bits 41, parity bits 42 and check nodes 43, is shown in FIG. 5. Decoding of these codes is performed using iterative message-passing methods known for LDPC codes, such as sum-product algorithm (SPA) or min-sum sum (MS) algorithm. However, the parity bits using degree-2 and degree-1 variable nodes are vulnerable to errors and converge slowly during iterative decoding of these codes.

In accordance with embodiments of the present invention, methods of decoding eIRA codes are modified to use an iterative scheme with hybrid operations. At each iteration, the systematic (user) bits 41 and low-degree unsystematic (parity) bits, among the parity bits 42, are decoded alternatively. The user bits 41 are decoded one-by-one using SPA or MS operations with vertical shuffling. The low-degree unsystematic (parity) bits are jointly decoded using the results of the user bits 41. The results from the joint decoding of the low-degree parity bits is used for the next iteration. This hybrid scheduling scheme of the iterative decoder, e.g., the LDPC decoder 135, improves the decoding of the parity bits 42 and allows faster exchange of messages between the user bits 41.

In decoding LDPC codes, a SPA or MS algorithm may be used for the user bits 41, where variable and check nodes are updated iteratively using their corresponding operations. Vertical, horizontal and parallel (i.e., flooding) scheduling methods are used to decide the order in which the nodes are updated in any iteration. In a flooding scheduling method, all variable nodes are updated once, followed by check nodes. In a vertical scheduling method, all variable nodes are updated one at time, and the check nodes connected to the last updated variable node are updated immediately after the variable node operation completes. In a horizontal scheduling method, all check nodes are updated one at a time, and all variable nodes connected to the last updated check node are updated immediately after the check node operation is completed.

Extended IRA (eIRA) codes can be decoded like LDPC codes using a SPA or MS algorithm with any of these scheduling methods. However, as previously noted, the parity bits correspond to degree-2 and degree-1 variable nodes and are therefore more vulnerable to errors than other bits. The low degree of these variable nodes also causes them to require a larger number of iterations to converge in most cases. Therefore, in accordance with embodiments of the present invention, the parity bits are decoded jointly using a separate operator (parity nodes operator) as shown in FIG. 6.

Figure 6:
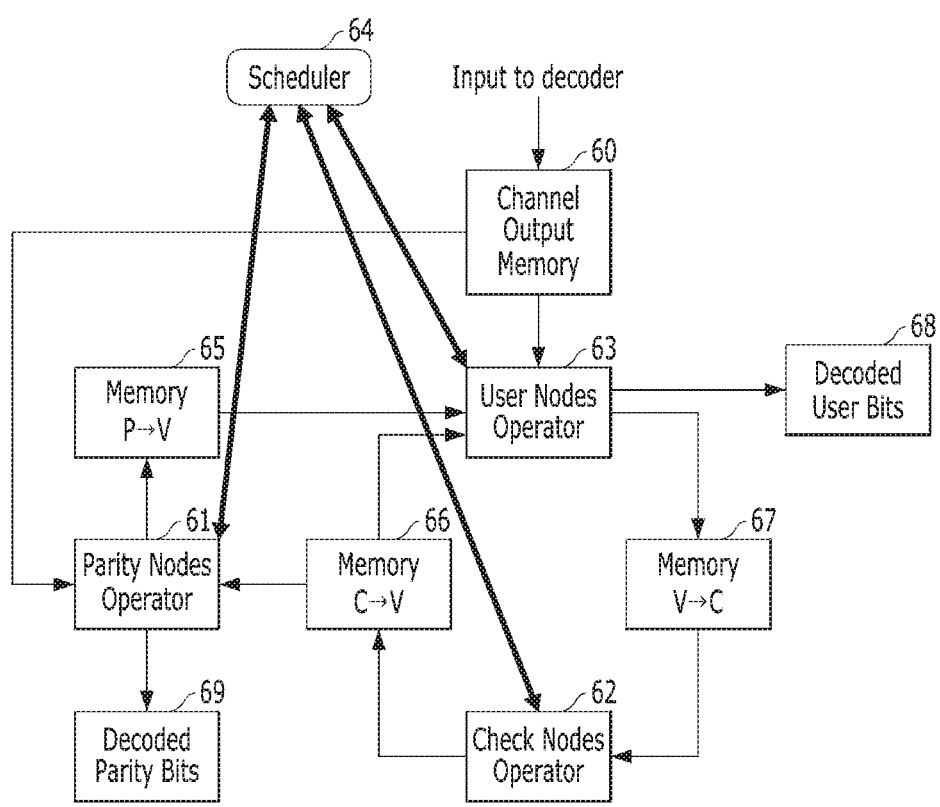
FIG. 6 is a block diagram showing processing blocks for decoding eIRA code with a joint decoding scheme for parity bits different than that used for the user bits.

FIG. 6 is a block diagram showing processing blocks for decoding eTRA code with a joint decoding scheme for parity bits different than that used for the user bits. The processing blocks may be implemented in any suitable combination of hardware, software and firmware. The processing blocks may be embodied in the decoder 135. The processing blocks include a parity nodes operator 61, a check nodes operator 62, a user nodes operator 63, and a scheduler 64. A channel output memory 60 receives data and information from the channel and stores the same. The channel output is provided to both the parity nodes operator 61 and the user nodes operator 63.

Thus, the general architecture of the LDPC decoder 135 employs separate operators for parity nodes, check nodes and user nodes, as shown in FIG. 6. To that end, the output of the parity nodes operator 61 is stored in a memory P→V 65, and the output of the check nodes operator 62 is stored in a memory C→V 66. Both of these memories 65, 66 are accessible by the user nodes operator 63, which accesses the information stored in those memories. The output of the user nodes operator 63 is stored in a memory V→C 67, the content of which is accessible by the check nodes operator 62. The P, V and C designations refer to information pertaining to parity nodes, user nodes and check nodes, respectively. The scheduler 64 interfaces with each of the parity nodes operator 61, the check nodes operator 62 and the user nodes operator 63. The decoded user bits are output from the user nodes operator 63, as indicated by block 68, and the decoded parity bits are output from the parity nodes operator 61, as indicated by block 69.

In operation, the parity nodes operator 61 uses the estimates from the variable nodes corresponding to the user bits. These estimates are summarized by the check nodes operator 62 and stored in the memory C→N 66, along with decoding estimates generated by the check nodes operator 62. The information stored in the memory 66 is accessed by the parity nodes operator 61. The parity nodes operator 61 uses these estimates, as well as information from the channel obtained from channel output memory 60, and computes its decision for the parity bits. The parity nodes operator 61 also computes information to be stored in memory P→V 65 and then passed to the user nodes operator 63 for variable nodes corresponding to the user bits. In an embodiment, the parity nodes operator 61 performs multiple message-passing updates on the Tanner graph corresponding to the bi-diagonal structure of the parity-check matrix. In another embodiment, the parity nodes operator 61 performs maximum likelihood estimation on the parity bits sequence using a Viterbi algorithm, Soft-Output Viterbi algorithm (SOYA) or Bahl-Cocke-Jelinek-Raviv (BCJR) algorithm.

The scheduler 64 shown in FIG. 6 controls the order in which user nodes operator 63, the check nodes operator 62 and the parity nodes operator 61 are used. According to embodiments of the present invention, the scheduler 64 uses the vertical shuffling method up to the variable nodes corresponding to the user bits. For the parity bits, the scheduler 64 directs the joint decoding using the parity nodes operator 61. The hybrid scheduling method, according to embodiments of the present invention, is shown in FIG. 7.

Figure 7:
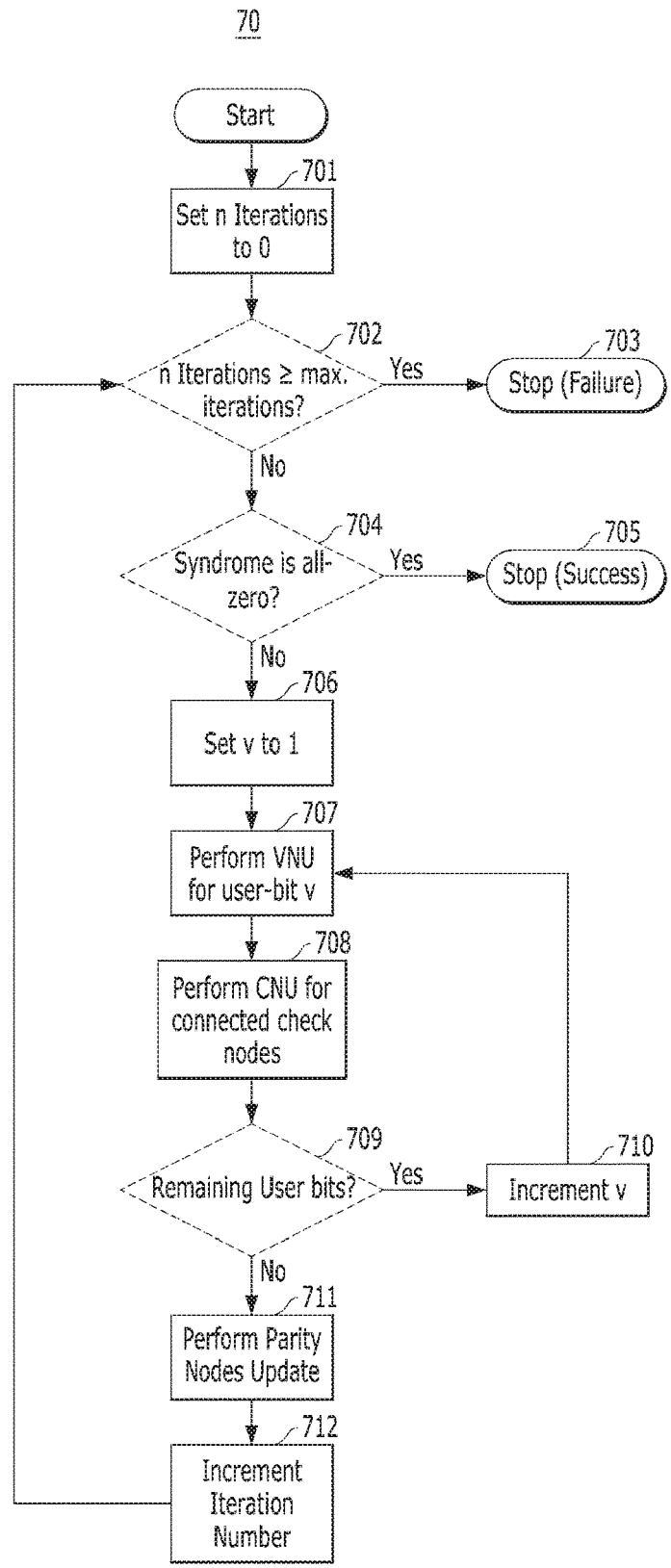
FIG. 7 is a flow chart illustrating a hybrid scheduling decoding scheme in accordance with embodiments of the present invention.

Referring to FIG. 7, a hybrid scheduling method 70 starts by setting the iterations number n to 0 at step 701. A check to determine whether or not a maximum number of iterations has been reached, that is whether n≥maximum (max.) iterations, is scheduled at step 702. At the first iteration such check is perfunctory. As the number of iterations performed increases, however, the check becomes more meaningful. When the current iteration number is greater than or equal to the maximum number of iterations allowed, the method stops and decoding failure is declared as indicated in block 703. The maximum number of iterations may be set to any suitable number considering system and use constraints.

When the maximum number of iterations has not been reached (No at step 703), the method proceeds to step 704, where it is determined whether or not prior decoding has resulted in the syndrome becoming all zeros. If so, the decoding was successful and the method stops (705).

When further decoding is required because the syndrome vector is not zero (No at step 704), the method proceeds to step 706, where v is set to 1, where v represents the user bit selected for current processing. At step 707, variable node update (VNU) processing is performed for user bit v. Then, at step 708, check node update (CNU) processing is performed for connected check nodes. Steps 707 and 708 are performed for each user bit.

Thus, at step 709, it is determined whether there are any remaining user bits. If so, v is incremented at step 710, and the method returns to step 707. If there are no unprocessed user bits (No at step 709), the method proceeds to step 711, where parity nodes update is performed.

After step 711, the iteration number is incremented at step 712 and the method returns to step 702 for a determination as to whether the maximum number of iterations has been reached.

Figure 8:
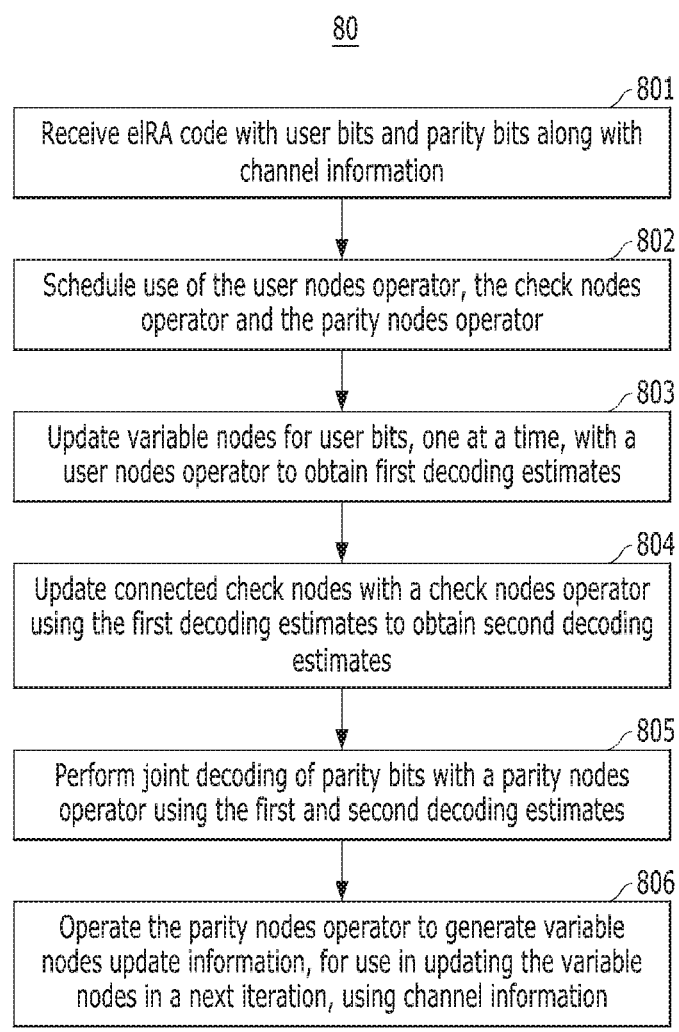
FIG. 8 is a flow chart illustrating steps in processes for decoding eIRA codes in accordance with embodiments of the present invention.

FIG. 8 is a flow chart describing steps in processes for decoding eIRA codes in accordance with embodiments of the present invention. The steps shown in flow chart 80 are exemplary. Those skilled in the art will understand that additional and/or alternative steps may be performed, or that the order of steps may be changed, to effectuate aspects of the present invention without departing from the inventive concepts disclosed herein. FIG. 8 is described with reference to other figures, particularly FIGS. 2 and 6.

A code, e.g., an eIRA code, for decoding is received from the memory device 200, e.g., NAND flash memory, for decoding, along with channel information at step 801. The eIRA code contains user bits and parity bits. The channel information may be stored in the channel output memory 60, which information is accessible by the user nodes operator 63 and the parity nodes operator 61.

The scheduler 64 is executed to schedule the use of the user nodes operator 63, the check nodes operator 62 and the parity nodes operator 61, as represented by step 802.

At step 803, the user nodes operator 63 is scheduled to update variable nodes for user bits, preferably one at a time, to obtain first decoding estimates. Such estimates may be stored in the memory 67.

At step 804, the check nodes operator 62 is scheduled to update connected check nodes using the first decoding estimates to obtain second decoding estimates. The connected check nodes may be those connected to the last updated variable node. The second decoding estimates may be stored in the memory 66.

At step 805, the parity nodes operator 61 is scheduled to jointly decode the parity bits using the first and second decoding estimates, which may be retrieved from the memory 67. The parity nodes operator 61 is also operated at step 806 to generate variable nodes update information for use in updating the variable nodes in a next iteration, using channel information that is supplied to the parity nodes operator 61.

As the foregoing demonstrates, embodiments of the present invention provide improved decoding of LDPC codes, particularly eTRA codes in which parity bits associated with low degree variable nodes are effectively decoded. Correction capability is increased and latency is reduced.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
   a decoder configured to perform decoding of user bits and parity bits including parity bits which are stored in a memory system corresponding to low degree variable nodes in the memory system;

wherein the decoder is further configured to perform for each of the user bits:
a variable node update operation for a variable node associated with each of the user bits, and
a check node update operation for check nodes connected to the variable node;
wherein the decoder comprises a parity nodes operator configured to jointly perform a parity node update operation, separate from the variable and check node update operations, for the parity bits using results of the variable node and check node update operations performed on the user bits.

2. The memory controller of claim 1, wherein the user bits and the parity bits are elements of an extended irregular repeat-accumulate (eIRA) code.

3. The memory controller of claim 1, wherein the decoder comprises a low-density parity-check (LDPC) decoder.

4. The memory controller of claim 1, wherein the decoder decodes the user bits one-by-one using a sum-product algorithm or a min-sum algorithm with vertical shuffling.

5. The memory controller of claim 1, wherein the low degree variable nodes comprise degree-1 and degree-2 variable nodes.

6. A decoder in a memory system comprising:
a user nodes operator configured to update variable nodes for associated user bits stored in the memory system to obtain first decoding estimates;
a check nodes operator configured to update check nodes connected to each of the variable nodes to obtain second decoding estimates;
a parity nodes operator configured to jointly update parity nodes associated with parity bits stored in the memory system using the first and second decoding estimates; and
a scheduler configured to control the order in which the user nodes operator, the check nodes operator and the parity nodes operator are used.

7. The decoder of claim 6, wherein the scheduler schedules the user nodes operator and check nodes operator to iteratively update the variable nodes and check nodes respectively.

8. The decoder of claim 6, further comprising:
a first memory that stores the second decoding estimates of the check nodes operator, the first memory being accessible by the parity nodes operator and the user nodes operator.

9. The decoder of claim 8, further comprising:
a second memory that stores information on the update of parity bits by the parity nodes operator, the second memory being accessible by the user nodes operator.

10. The decoder of claim 9, further comprising:
a third memory that stores the first decoding estimates of the user nodes operator, the third memory being accessible by the check nodes operator.

11. The decoder of claim 9, wherein the parity nodes operator generates information for the user bits that is stored in the second memory and accessed by the user nodes operator.

12. The decoder of claim 6, wherein:
the user bits and parity bits are elements of an extended irregular repeat-accumulate (eIRA) code, the parity bits being represented by a parity-check matrix having a bi-diagonal structure; and
parity nodes operator updates the parity nodes by performing multiple message-passing updates on a Tanner graph corresponding the bi-diagonal structure of the parity-check matrix.

13. The decoder of claim 6, wherein the parity nodes operator updates the parity nodes by performing maximum likelihood estimation on the parity bits.

14. A method of decoding a low-density parity-check (LDPC) code on encoded data stored in a memory system, the method comprising the steps of:
performing, by a user nodes operator, a variable node update operation for a first user bit;
performing, by a check nodes operator, a check node update operation for each check node connected to the variable node for the first user bit stored in the memory system;
repeating the performing of the variable node and check node update operations for each of subsequent user bits of the LDPC code, the subsequent user bits following the first user bit; and
jointly performing, by a parity nodes operator, an update on parity nodes associated with parity bits stored in the memory system using information obtained from the variable node and check node update operations.

15. The method of claim 14, further comprising the step of:
determining whether or not a syndrome of the LDPC code is zero, after performing the update on the parity nodes.

16. The method of claim 15, further comprising:
repeating the steps of claim 14, if it is determined that the syndrome is not zero.

17. The method of claim 14, wherein the LDPC code is an extended irregular repeat-accumulate (eIRA) code defined by a matrix of which the user bits and parity bits are elements, the parity bits in the matrix having a bi-diagonal structure.

18. The method of claim 17, wherein the step of performing of the update on the parity nodes comprises performing multiple message-passing updates on a Tanner graph corresponding to the bi-diagonal structure of the parity bits in the matrix.

19. The method of claim 14, wherein the step of performing the update on the parity nodes comprises performing maximum likelihood estimation on the parity bits.

* * * * *